United States Patent
Hong et al.

(10) Patent No.: US 9,620,364 B2
(45) Date of Patent: Apr. 11, 2017

(54) METHODS OF MANUFACTURING SEMICONDUCTOR DEVICE

(71) Applicant: Samsung Electronics Co., Ltd., Suwon-si (KR)

(72) Inventors: Hyun-Sil Hong, Hwaseong-si (KR); Sungil Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 27 days.

(21) Appl. No.: 14/715,631

(22) Filed: May 19, 2015

(65) Prior Publication Data

US 2016/0104618 A1    Apr. 14, 2016

(30) Foreign Application Priority Data

Oct. 10, 2014   (KR) .................. 10-2014-0136843

(51) Int. Cl.

| | |
|---|---|
| *H01L 21/033* | (2006.01) |
| *H01L 21/31* | (2006.01) |
| *H01L 21/311* | (2006.01) |
| *H01L 21/02* | (2006.01) |
| *H01L 27/108* | (2006.01) |
| *H01L 49/02* | (2006.01) |

(52) U.S. Cl.
CPC ...... *H01L 21/0332* (2013.01); *H01L 21/0217* (2013.01); *H01L 21/02164* (2013.01); *H01L 21/0334* (2013.01); *H01L 21/31* (2013.01); *H01L 21/31144* (2013.01); *H01L 27/10852* (2013.01); *H01L 28/90* (2013.01)

(58) Field of Classification Search
CPC .................................................. H01L 21/0332
See application file for complete search history.

(56) References Cited

U.S. PATENT DOCUMENTS

| | | | |
|---|---|---|---|
| 6,756,314 B2 | 6/2004 | Baier | |
| 7,115,525 B2* | 10/2006 | Abatchev | H01L 21/0332 |
| | | | 257/E21.024 |
| 2005/0161435 A1 | 7/2005 | Kobayashi | |
| 2006/0273465 A1 | 12/2006 | Tamura | |
| 2009/0032963 A1* | 2/2009 | Tran | H01L 21/02164 |
| | | | 257/774 |

(Continued)

FOREIGN PATENT DOCUMENTS

JP     2011-044493     3/2011

*Primary Examiner* — Lex Malsawma
(74) *Attorney, Agent, or Firm* — Myers Bigel, P.A.

(57) ABSTRACT

A method of manufacturing a semiconductor device is provided. The method includes forming a molding layer and a supporter layer on a semiconductor substrate, forming a multiple mask layer including a first mask layer and a second mask layer formed on the first mask layer, on the supporter layer. The first mask layer is formed of a material having an etch selectivity with respect to the molding layer and the second mask layer is formed of a material having an etch selectivity with respect to the supporter layer. The method includes forming a first mask pattern and a second mask pattern formed on the first mask pattern by patterning the multiple mask layer, etching the supporter layer by performing a first etching process using the second mask pattern as an etch mask, etching the molding layer, and forming a hole by performing a second etching process using the first mask pattern as an etch mask.

19 Claims, 14 Drawing Sheets

(56) References Cited

U.S. PATENT DOCUMENTS

| | | | |
|---|---|---|---|
| 2010/0065531 A1* | 3/2010 | Kiehlbauch | H01L 21/0337 216/41 |
| 2013/0095663 A1* | 4/2013 | Seo | H01L 21/0337 438/696 |
| 2014/0162427 A1* | 6/2014 | Gwak | H01L 21/0337 438/381 |

* cited by examiner

//patents.google.com/patent/US9620364B2

METHODS OF MANUFACTURING SEMICONDUCTOR DEVICE

CROSS-REFERENCE TO RELATED APPLICATION

This application claims priority under 35 U.S.C. §119 to Korean Patent Application No. 10-2014-0136843 filed on Oct. 10, 2014, the disclosure of which is hereby incorporated by reference in its entirety.

FIELD

Embodiments of the present inventive concept relate to a method of manufacturing a semiconductor device including a capacitor.

BACKGROUND

While the degree of integration of a semiconductor device has been increased, areas occupied by holes, plugs, contacts, and capacitors included in the semiconductor devices are being reduced. Intervals between each patterns are becoming very small.

Moreover, in the case of a DRAM device, due to an increase of an aspect ratio of a storage electrode (a lower electrode) of a capacitor, formation of supporters for supporting the storage electrode of the capacitor has been proposed.

Processes for forming the storage electrode having a high aspect ratio and the supporters have been studied.

SUMMARY

In accordance with some embodiments of the present inventive concept, a method of manufacturing a semiconductor device may include sequentially forming a molding layer and a supporter layer on a semiconductor substrate, and forming a multiple mask layer including a first mask layer and a second mask layer formed on the first mask layer, on the supporter layer. The first mask layer may be formed of a material having an etch selectivity with respect to the molding layer and/or the second mask layer may be formed of a material having an etch selectivity with respect to the supporter layer. The method may include patterning the multiple mask layer to form a first mask pattern and a second mask pattern formed on the first mask pattern, performing a first etching process using the second mask pattern as an etch mask to etch the supporter layer, and performing a second etching process using the first mask pattern as an etch mask to etch the molding layer, and form a hole.

In some embodiments, the method may further include forming a storage electrode in the hole, patterning the supporter layer and forming a supporter pattern, removing the molding layer and exposing the storage electrode and the supporter pattern, conformally forming a dielectric layer on the storage electrode and the supporter pattern, and/or forming a plate electrode on the dielectric layer.

In some embodiments, the second mask pattern may be etched and removed during the first etching process.

In still other embodiments, the method may further include removing the first mask pattern after completing the second etching process.

In some embodiments, the first mask layer may include a metal nitride.

In some embodiments, the metal nitride may include TiN, TaN, WN, AlN, or GaN.

In some embodiments, the second mask layer may be formed of silicon.

In some embodiments, the second mask layer may include polysilicon.

In some embodiments, the molding layer may include silicon oxide and the supporter layer may include silicon nitride.

In some embodiments, the method may include forming a buffer layer between the supporter layer and the first mask layer. The buffer layer may be etched during the first etching process.

In accordance with some embodiments of the present inventive concept, a method of manufacturing a semiconductor device may include sequentially forming a lower molding layer, a lower supporter layer, an upper molding layer, and an upper supporter layer on a semiconductor substrate, forming a multiple mask layer including a first mask layer, a second mask layer, a third mask layer, and a fourth mask layer, which are sequentially stacked on the upper supporter layer, patterning the multiple mask layer to form a first mask pattern, a second mask pattern, a third mask pattern, and a fourth mask pattern, which are stacked, performing a first etching process using the fourth mask pattern as an etch mask to etch the upper supporter layer, performing a second etching process using the third mask pattern as an etch mask to etch the upper molding layer, performing a third etching process using the second mask pattern as an etch mask to etch the lower supporter layer, performing a fourth etching process using the first mask pattern as an etch mask to etch the lower molding layer and form a hole.

In some embodiments, the first and third mask layers each may include nitride including a metal.

In some embodiments, the second and fourth mask layers each may include polysilicon.

In some embodiments, the molding layer may include silicon oxide and the supporter layer may include silicon nitride.

In some embodiments, the method may further include forming a storage electrode in the hole, patterning the upper supporter layer to form a supporter pattern, removing the upper molding layer, the lower supporter layer, and the lower molding layer and exposing the storage electrode and the supporter pattern, conformally forming a dielectric layer on the storage electrode and the supporter pattern, and/or forming a plate electrode on the dielectric layer.

In some embodiments, the removing of the upper molding layer, the lower supporter layer, and the lower molding layer may include removing the upper molding layer and the lower molding layer, and patterning the lower supporter layer to be aligned with the supporter pattern.

In accordance with some embodiments of the present inventive concept, a method of manufacturing a semiconductor device may include forming a molding layer on a semiconductor substrate, forming a supporter layer on the molding layer having an etch selectivity with respect to the molding layer, forming a first mask layer including a metal nitride having an etch selectivity with respect to the molding layer on the supporter layer, forming a second mask layer including silicon having an etch selectivity with respect to the supporter layer on the first mask layer, patterning the first and second mask layers to form a first mask pattern and a second mask pattern, which are sequentially stacked, performing a first etching process using the second mask pattern as an etch mask to etch the supporter layer, performing a second etching process using the first mask pattern as an etch mask to etch the molding layer, and form a hole, forming a storage electrode in the hole, etching the supporter layer to form a supporter pattern, removing the molding layer to expose the supporter pattern and the storage electrode, forming a dielectric layer on the supporter pattern and the storage electrode, and forming a plate electrode on the dielectric layer.

In some embodiments, the metal nitride may include TiN, TaN, WN, AlN, or GaN.

In some embodiments, the forming of the supporter pattern may include patterning the supporter layer to be connected to portions of side surfaces of the storage electrode.

In some embodiments, the molding layer may include silicon oxide, and the supporter layer may include silicon nitride.

In accordance with some embodiments of the present inventive concept, a method of manufacturing a semiconductor device may include forming a molding layer on a semiconductor substrate, forming a supporter layer on the molding layer, and forming a first mask layer, having a first etch selectivity with respect to the molding layer, on the supporter layer. The method may include forming a second mask layer, having a second etch selectivity, different from the first etch selectivity, with respect to the supporter layer, on the first mask layer, and performing a first etching process using a first etchant to etch the supporter layer. The second mask layer may be used as an etch mask for the first etching process. The method may include performing a second etching process using a second etchant to etch the molding layer. The first mask layer may be used as an etch mask for the second etching process.

According to some embodiments, the first mask layer may be of a thickness h1 and the second mask layer may be of a thickness h2. The thickness h1 may be less than the thickness h2. The second mask layer may include polysilicon and/or a metal nitride. The molding layer may include silicon oxide and the supporter layer may include silicon nitride The method may further include forming a buffer layer between the supporter layer and the first mask layer. The buffer layer may be etched during the first etching process. The first etchant used by the first etch process to etch the supporter layer may include $CHF_3$ and/or $CH_2F_2$. The second etchant used by the second etch process to etch the molding layer may include $C_4F_8$ and/or $C_4F_6$.

Details of other embodiments are included in detailed explanations and the drawings.

BRIEF DESCRIPTION OF THE DRAWINGS

The foregoing and other features and advantages of the present inventive concept will be apparent from the more particular description of embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings.

DETAILED DESCRIPTION OF THE EMBODIMENTS

Figure 1A:
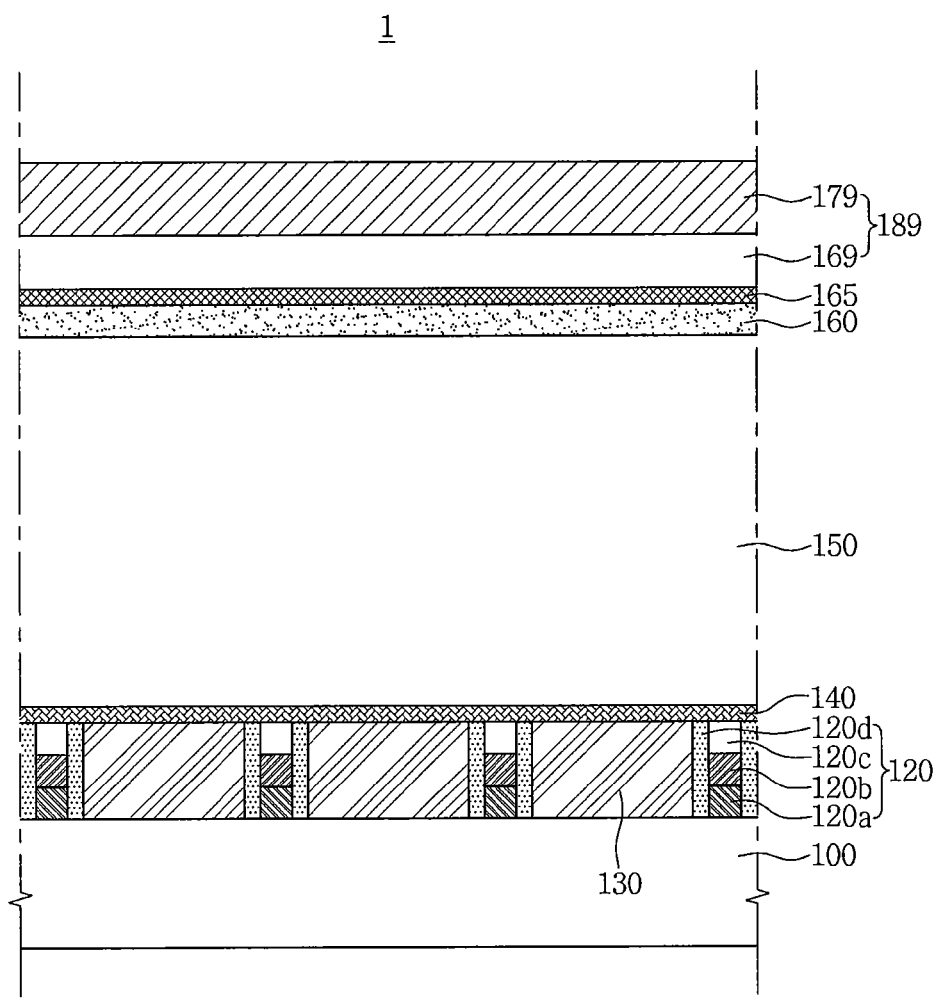
FIGS. 1A to 1F are cross-sectional views for describing methods of manufacturing a semiconductor device in accordance with various embodiments of the present inventive concept.

Advantages and features of the present inventive concept and methods of accomplishing them will be made apparent with reference to the accompanying drawings and some embodiments to be described below. The inventive concept may, however, be embodied in various different forms, and should not be construed as being limited by the embodiments set forth herein. Rather, these embodiments are provided so that this disclosure is thorough and complete and fully conveys the present inventive concept to those skilled in the art. In the drawings, the sizes and relative sizes of layers and regions may be exaggerated for clarity. The same reference symbols denote the same components throughout the specification.

Embodiments are described herein with reference to cross-sectional views, plan views, and/or block diagrams that are schematic illustrations of idealized embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. Therefore, regions illustrated in the drawings are schematic in nature, and their shapes are not intended to limit the present inventive concept but only to illustrate characteristic forms of regions of devices.

The thicknesses of layers and regions in the drawings may be exaggerated for the sake of clarity. Further, it will be understood that when a layer is referred to as being "on" another layer or a substrate, the layer may be formed directly on the other layer or the substrate, or there may be an intervening layer therebetween. The same reference numerals indicate the same components throughout the specification.

Terms such as "top," "bottom," "upper," "lower," "above," "below," and the like are used herein to describe the relative positions of elements or features. It will be understood that such descriptions are intended to encompass different orientations in use or operation in addition to orientations depicted in the drawings. For example, when an upper part of a drawing is referred to as a "top" and a lower part of a drawing as a "bottom" for the sake of convenience, in practice, the "top" may also be called a "bottom" and the "bottom" a "top" without departing from the teachings of the present inventive concept.

Furthermore, throughout this disclosure, directional terms such as "upper," "intermediate," "lower," and the like may be used herein to describe the relationship of one element or feature with another, and the present inventive concept should not be limited by these terms. Accordingly, these terms such as "upper," "intermediate," "lower," and the like may be replaced by other terms such as "first," "second," "third," and the like to describe the elements and features.

It will be understood that, although the terms "first," "second," etc. may be used herein to describe various elements, these elements should not be limited by these terms. These terms are only used to distinguish one element from another. Thus, a first element could be termed a second element without departing from the teachings of the present inventive concept.

The terminology used herein to describe embodiments of the invention is not intended to limit the scope of the present inventive concept.

As used herein, the singular forms "a," "an," and "the" are intended to include the plural forms as well, unless the context clearly indicates otherwise. It will be further understood that the terms "comprises," "comprising," "includes," and/or "including," and variants thereof when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments of the present inventive concept arise from the recognition that when the mask pattern is thickly formed, a lithography process and/or an etch process becomes difficult. Thus, an etching distribution failure may be caused on the molding layer and the supporter layer.

FIGS. 1A to 1F are cross-sectional views for describing a method of manufacturing a semiconductor device in accordance with various embodiments of the inventive concept.

Referring to FIG. 1A, the method of manufacturing the semiconductor device 1 in accordance with some embodiments of the inventive concept may include forming bit line structures 120 and contact pads 130 on a semiconductor substrate 100, sequentially forming a stopping insulating layer 140, a molding layer 150, a supporter layer 160, and a buffer layer 165 on the bit line structures 120 and the contact pads 130, and forming a multiple mask layer 189 on the buffer layer 165.

The semiconductor substrate 100 may include a single crystalline silicon substrate, a silicon on insulator (SOI) substrate, and/or a silicon-germanium substrate, etc.

The bit line structures 120 each may include a bit line contact plug 120a, a bit line electrode 120b, and a bit line capping layer 120c, which are sequentially stacked. Further, the bit line structures 120 each may include a bit line spacer 120d formed on side surfaces of the bit line contact plug 120a, the bit line electrode 120b, and the bit line capping layer 120c.

The contact pads 130 may be formed between the bit line structures 120 after forming the bit line structures 120.

The stopping insulating layer 140 may be formed of an insulating material on the bit line structures 120 and the contact pads 130 by performing a deposition process. The stopping insulating layer 140 may include silicon nitride.

The molding layer 150 may be formed of an insulating material having an etch selectivity with respect to the stopping insulating layer 140 on the stopping insulating layer 140. For example, the stopping insulating layer 140 may include silicon nitride and the molding layer 150 may include silicon oxide.

The supporter layer 160 may be formed of an insulating material having an etch selectivity with respect to the molding layer 150. The supporter layer 160 may be formed on the molding layer 150 by performing a deposition process. The supporter layer 160 may include an insulating material which is relatively harder than the molding layer 150. For example, the supporter layer 160 may include silicon nitride.

The buffer layer 165 may be formed of an insulating material on the supporter layer 160 by performing a deposition process. For example, the buffer layer 165 may include silicon oxide.

The forming of the multiple mask layer 189 may include sequentially forming a first mask layer 169 having etch selectivity with respect to the molding layer 150, and a second mask layer 179 having an etch selectivity with respect to the supporter layer 160, on the buffer layer 165.

The first mask layer 169 may be formed of a material having etch selectivity with respect to the molding layer 150 including a silicon oxide layer. The first mask layer 169 may include a nitride layer including a metal. For example, the first mask layer 169 may include TiN, TaN, WN, AlN, or GaN.

The second mask layer 179 may be formed of a material having an excellent etch selectivity with respect to the supporter layer 160 including a silicon nitride layer. The second mask layer 179 may include silicon. For example, the second mask layer 179 may include polysilicon.

Figure 1B:
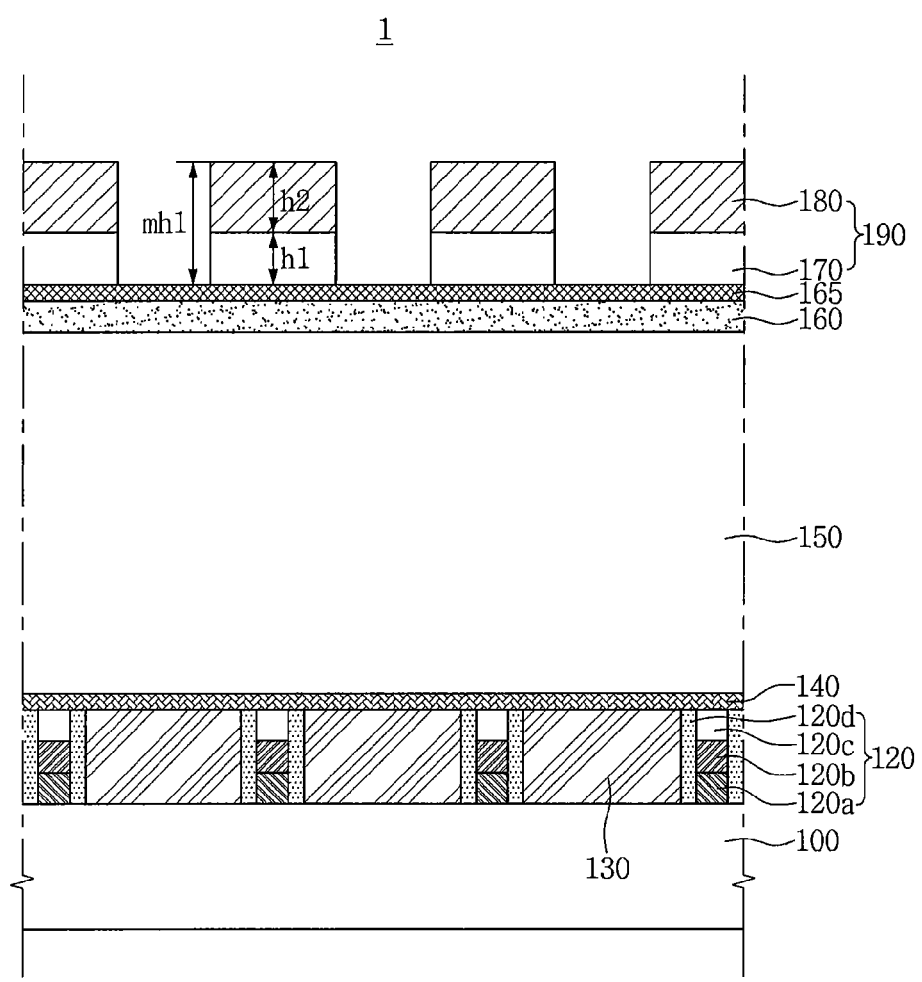

Referring to FIG. 1B, the method of manufacturing the semiconductor device 1 in accordance with some embodiments of the present inventive concept may include forming a multiple mask pattern 190 on the buffer layer 165. The multiple mask pattern 190 may include a first mask pattern 170 and a second mask pattern 180 formed on the first mask pattern 170, which are sequentially stacked.

The forming of the multiple mask pattern 190 may include forming the first mask pattern 170 and the second mask pattern 180, which selectively expose the buffer layer 165, by performing a lithography process and/or an etch process on the first mask layer 169 and the second mask layer 179 of FIG. 1A, which are formed on the buffer layer 165.

The first mask pattern 170 may have a thickness h1 and the second mask pattern 180 may have a thickness h2 which is relatively greater than the thickness h1 of the first mask pattern 170. The multiple mask pattern 190 may have a thickness mh1 which is a sum of the thickness h1 and the thickness h2.

Figure 1C:
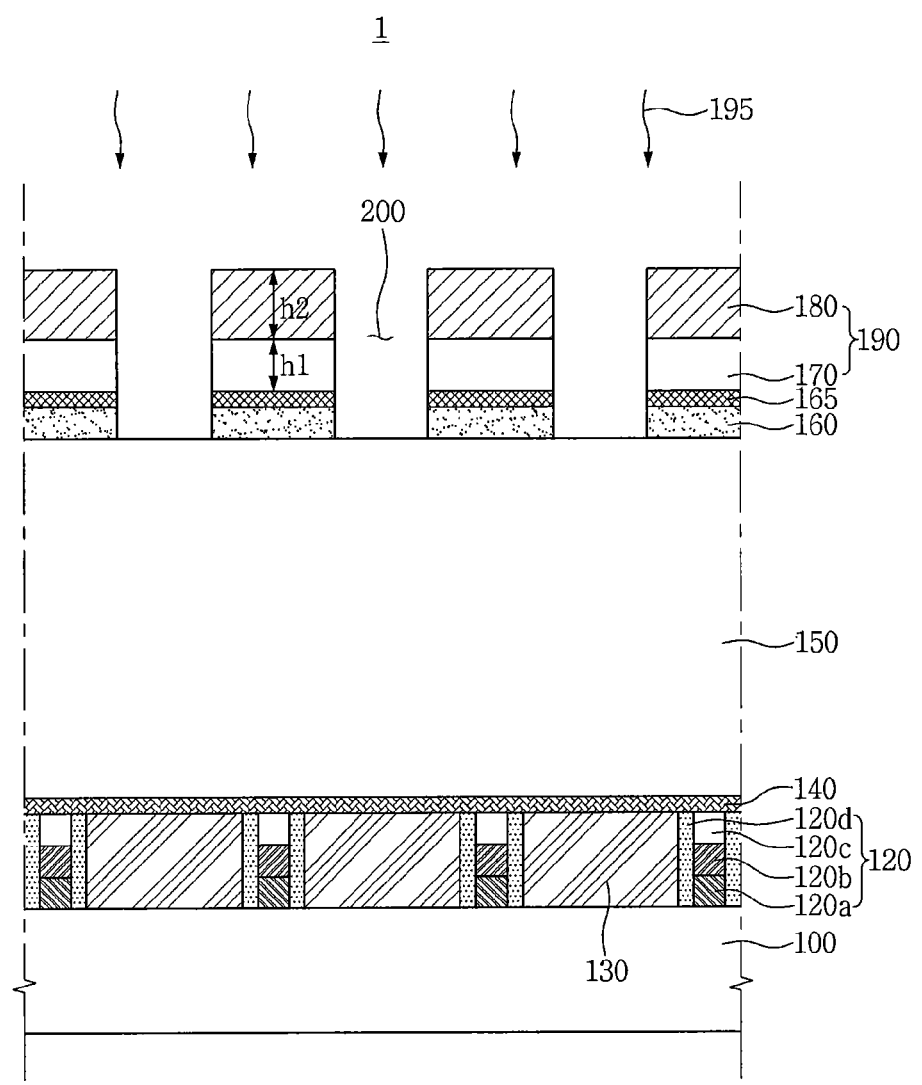

Referring to FIG. 1C, the method of manufacturing the semiconductor device 1 in accordance with some embodiments of the present inventive concept may include selectively etching the buffer layer 165 and the supporter layer 160 by performing a first etching process 195 using the multiple mask pattern 190 as an etch mask, and forming a first hole 200 which exposes an upper surface of the molding layer 150.

An etchant for forming the first hole 200 may include $CHF_3$ and/or $CH_2F_2$. The buffer layer 165 and the supporter layer 160 may be etched using the etchant.

When the first etching process 195 for forming the first hole 200 is performed, the second mask pattern 180 located on an upper end of the multiple mask pattern 190 may serve as a main mask. The second mask pattern 180 may include polysilicon having an etch selectivity with respect to the supporter layer 160. Thus, a loss rate of the second mask pattern 180 due to the etchant $CHF_3$ and/or $CH_2F_2$ used for etching the supporter layer 160 may be minimized. Therefore, since the thickness h2 of the second mask pattern 180 is minimized, it may function more favorably in a lithography process and/or an etch process.

In the process of performing the first etching process 195 for forming the first hole 200, the second mask pattern 180 may be removed. Alternatively, after the first etching process 195 is completed, the second mask pattern 180 may be removed.

Figure 1D:
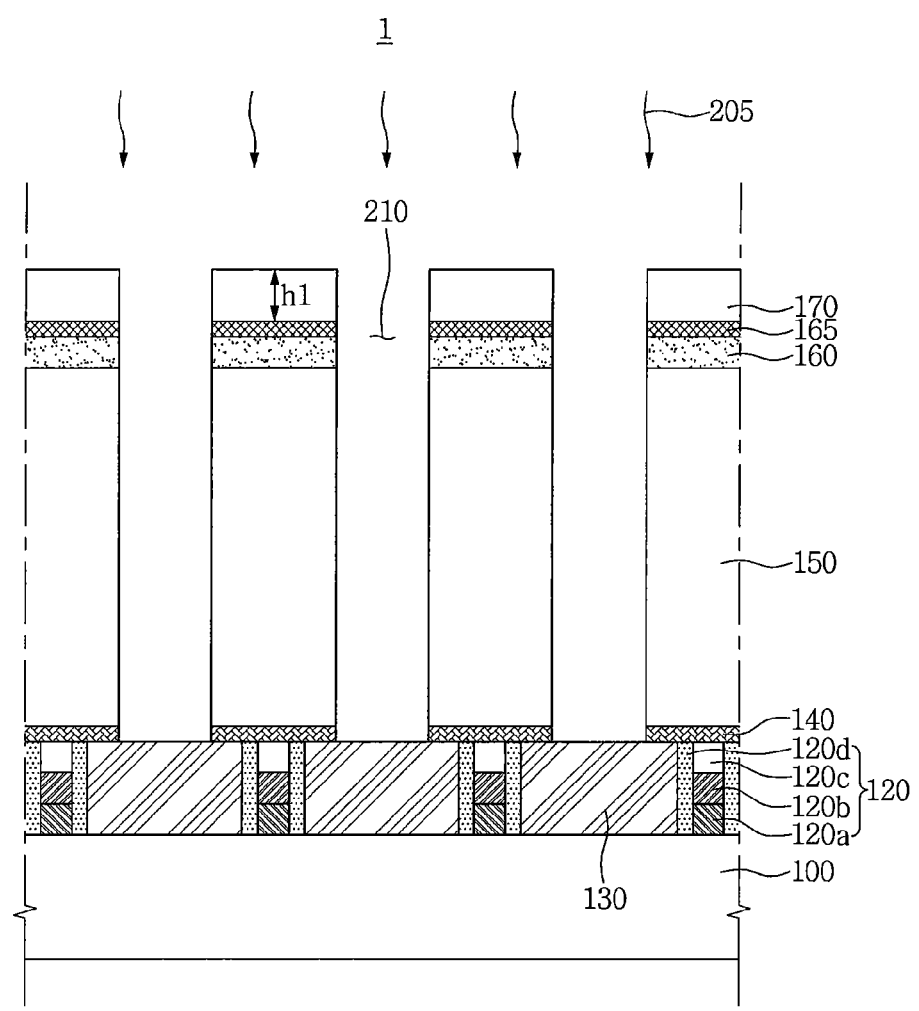

Referring to FIG. 1D, the method of manufacturing the semiconductor device 1 in accordance with various embodiments of the present inventive concept may include selectively etching the exposed molding layer 150 and the stopping insulating layer 140 by performing a second etching process 205 using the first mask pattern 170 as an etch mask, and forming a second hole 210 which exposes an upper surface of the contact pad 130.

The forming of the second hole 210 may include selectively removing the exposed molding layer 150 using the first mask pattern 170 as an etch mask, and exposing an upper surface of the stopping insulating layer 140. Then, the forming of the second hole 210 may include selectively removing the exposed stopping insulating layer 140 using the first mask pattern 170 as an etch mask, and exposing the contact pad 130.

An etchant for forming the molding layer 150 may include $C_4F_8$ and/or $C_4F_6$. The etchant may etch the molding layer 150 and the stopping insulating layer 140.

When the second etching process 205 is performed on the molding layer 150, the first mask pattern 170 may include a nitride layer having an etch selectivity with respect to the molding layer 150. Thus, a loss rate of the first mask pattern 170 by the etchant $C_4F_8$ and/or $C_4F_6$ used for etching the molding layer 150 may be minimized. Therefore, since the thickness h1 of the first mask pattern 170 is minimized, it may function more favorably in a lithography process and/or an etch process.

In the process of performing the second etching process 205 for forming the second hole 210, the first mask pattern 170 may be removed. Alternatively, after the second etching process 205 is completed, the first mask pattern 170 may be removed.

According to some embodiments of the present inventive concept, the multiple mask pattern 190 of FIG. 1C may be formed using material layers each having an excellent etch selectivity with respect to the molding layer 150 and the supporter layer 160. That is, the multiple mask pattern 190 may correspond one-to-one with respect to the molding layer 150 and the supporter layer 160.

Therefore, in two etching processes which etch the molding layer 150 and the supporter layer 160, since the first mask pattern 170 and the second mask pattern 180, which correspond to the molding layer 150 and the supporter layer 160, have very small loss rates, the mask patterns 170 and 180 may be formed to have the thicknesses h1 and h2 reduced. Thereby, the overall thickness mh1 of the multiple mask pattern 190 including the first mask pattern 170 and the second mask pattern 180 may be relatively reduced compared to a conventional single mask pattern. Further, as the overall thickness mh1 of the multiple mask pattern 190 is reduced, a lithography process and/or an etch process are easier and etching distributions of the etched layers (the molding layer 150 and the supporter layer 160) may be improved. Therefore, a storage electrode of a capacitor having a high aspect ratio may be implemented, and thus, capacitance of the capacitor may be increased.

Figure 1E:
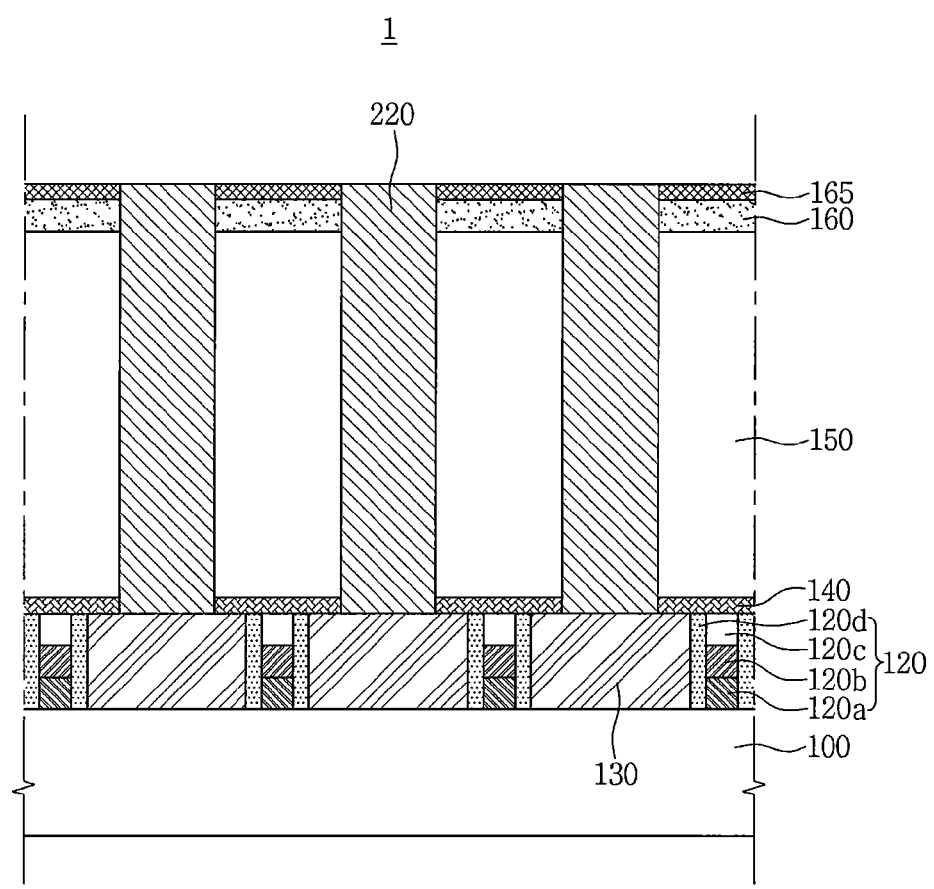

Referring to FIG. 1E, the method of manufacturing the semiconductor device 1 in accordance with various embodiments of the present inventive concept may include forming a storage electrode 220 inside the second hole 210.

The forming of the storage electrode 220 may include forming a conductive material on the semiconductor substrate 100 having the second hole 210 in order to fill the second hole 210, and planarizing the conductive material until an upper surface of the buffer layer 165 is exposed. The planarizing of the conductive material may be performed using an etch-back process or a chemical mechanical polishing process.

The storage electrode 220 may be formed of a conductive material such as a metal, a metal nitride, etc. For example, the storage electrode 220 may be formed of titanium nitride. The storage electrode 220 may be formed to vertically pass through the buffer layer 165, the supporter layer 160, the molding layer 150, and the stopping insulating layer 140.

Figure 1F:
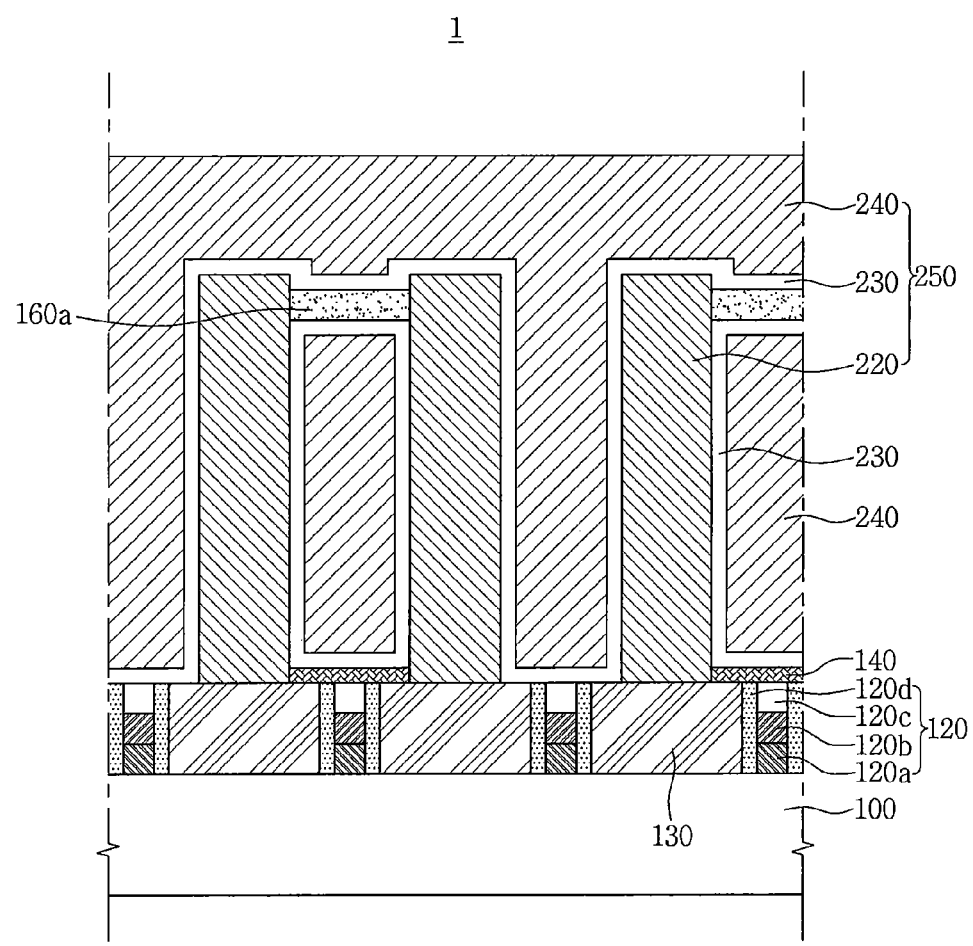

Referring to FIG. 1F, the method of manufacturing the semiconductor device 1 in accordance with various embodiments of the present inventive concept may include forming the supporter pattern 160a by patterning the supporter layer 160 of FIG. 1E, exposing the storage electrode 220 by removing the molding layer 150 of FIG. 1E, and sequentially forming a dielectric layer 230 and a plate electrode 240 on the substrate 100.

The forming of the supporter pattern 160a may include patterning the supporter layer 160 to form the supporter pattern 160a having an opening. The supporter pattern 160a may be connected to portions of side surfaces of the storage electrode 220. For example, the supporter pattern 160a may serve to support the storage electrode 220 so as to prevent a collapse thereof.

After the supporter pattern 160a is formed, the molding layer 150 of FIG. 1E exposed by the opening and the stopping insulating layer 140 of FIG. 1E may be removed using an etching process. In the process, the buffer layer 165 of FIG. 1E formed on the supporter pattern 160a may be also removed. The storage electrode 220 may be exposed by removing the molding layer 150 of FIG. 1E.

The dielectric layer 230 may be conformally formed on exposed surfaces of the storage electrode 220, the stopping insulating layer 140, and the supporter pattern 160a. The dielectric layer 230 may include a TaO layer, a TaON layer, a AlO layer, a HfO layer, a ZrO layer, a TiO layer, a BST ((Ba, Sr)TiO) layer, a STO (SrTiO) layer, a BTO (BaTiO) layer, a PZT (Pb(Zr,Ti)O) layer, a (Pb,La)(Zr,Ti)O layer, a Ba(Zr,Ti)O layer, a Sr(Zr,Ti)O layer, and/or a combination thereof.

The plate electrode 240 may be formed on the semiconductor substrate 100 on which the dielectric layer 230 is formed. The plate electrode 240 may be formed on the dielectric layer 230. The plate electrode 240 may include polysilicon, a metal, and/or a metal compound.

The storage electrode 220, the dielectric layer 230, and the plate electrode 240 may configure a capacitor 250. The storage electrode 220 may be a lower electrode of the capacitor 250, and the plate electrode 240 may be an upper electrode of the capacitor 250.

FIGS. 2A to 2G are cross-sectional views for describing a method of manufacturing a semiconductor device in accordance with various embodiments of the present inventive concept.

Figure 2A:
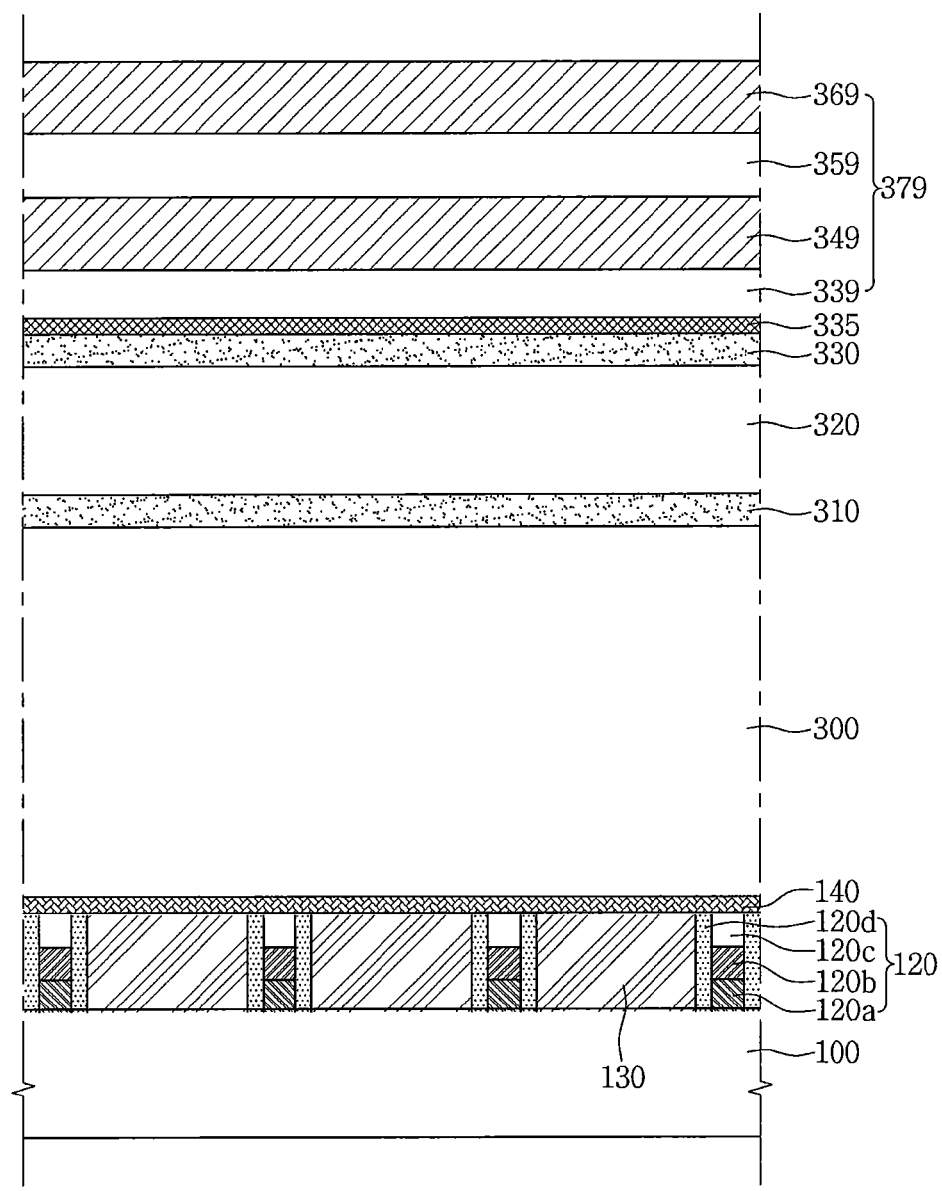
FIGS. 2A to 2G are cross-sectional views for describing a method of manufacturing a semiconductor device in accordance with various embodiments of the present inventive concept.

Referring to FIG. 2A, the method of manufacturing the semiconductor device 10 in accordance with various embodiments of the present inventive concept, may include forming bit line structures 120, contact pads 130, and a stopping insulating layer 140 on a semiconductor substrate 100, in substantially the same manner as described in FIG.

1A, sequentially forming a lower molding layer 300, a lower supporter layer 310, an upper molding layer 320, an upper supporter layer 330, and a buffer layer 335 on the stopping insulating layer 140, and forming a multiple mask layer 379 including a first mask layer 339, a second mask layer 349, a third mask layer 359, and a fourth mask layer 369 on the buffer layer 335.

The lower molding layer 300 may be formed of a material having an etch selectivity with respect to the stopping insulating layer 140 on the stopping insulating layer 140. For example, the stopping insulating layer 140 may include silicon nitride, and the lower molding layer 300 may include silicon oxide.

The lower supporter layer 310 may be formed of an insulating material having an etch selectivity with respect to the lower molding layer 300 on the lower molding layer 300. The lower supporter layer 310 may include an insulating material which is relatively harder than the lower molding layer 300. The lower supporter layer 310 may include silicon nitride.

The upper molding layer 320 may be formed of a material having an etch selectivity with respect to the lower supporter layer 310 on the lower supporter layer 310. For example, the lower supporter layer 310 may include silicon nitride, and the upper molding layer 320 may include silicon oxide.

The upper supporter layer 330 may be formed of an insulating material having an etch selectivity with respect to the upper molding layer 320 on the upper molding layer 320 by performing a deposition process. The upper supporter layer 330 may include an insulating material which is relatively harder than the upper molding layer 320. For example, the upper supporter layer 330 may include silicon nitride.

The buffer layer 335 may be formed of an insulating material on the upper supporter layer 330 by performing a deposition process. The buffer layer 335 may include silicon oxide.

The forming of the multiple mask layer 379 may include sequentially forming a first mask layer 339 having an etch selectivity with respect to the lower molding layer 300, a second mask layer 349 having an etch selectivity with respect to the lower supporter layer 310, a third mask layer 359 having an etch selectivity with respect to the upper molding layer 320, and a fourth mask layer 369 having an etch selectivity with respect to the upper supporter layer 330, on the buffer layer 335.

The first mask layer 339 may be formed of a material having an etch selectivity with respect to the lower molding layer 300 including a silicon oxide layer. The first mask layer 339 may include a nitride layer including a metal. The first mask layer 339 may include TiN, TaN, WN, AlN, or GaN.

The second mask layer 349 may be formed of a material having an etch selectivity with respect to the lower supporter layer 310 including a silicon nitride layer. The second mask layer 349 may include silicon. For example, the second mask layer 349 may include polysilicon.

The third mask layer 359 may be formed of a material having an etch selectivity with respect to the upper molding layer 320 including a silicon oxide layer. The third mask layer 359 may include a nitride layer including a metal. The third mask layer 359 may include TiN, TaN, WN, AlN, or GaN.

The fourth mask layer 369 may be formed of a material having an etch selectivity with respect to the upper supporter layer 330 including a silicon nitride layer. The fourth mask layer 369 may include silicon. For example, the fourth mask layer 369 may include polysilicon.

Figure 2B:
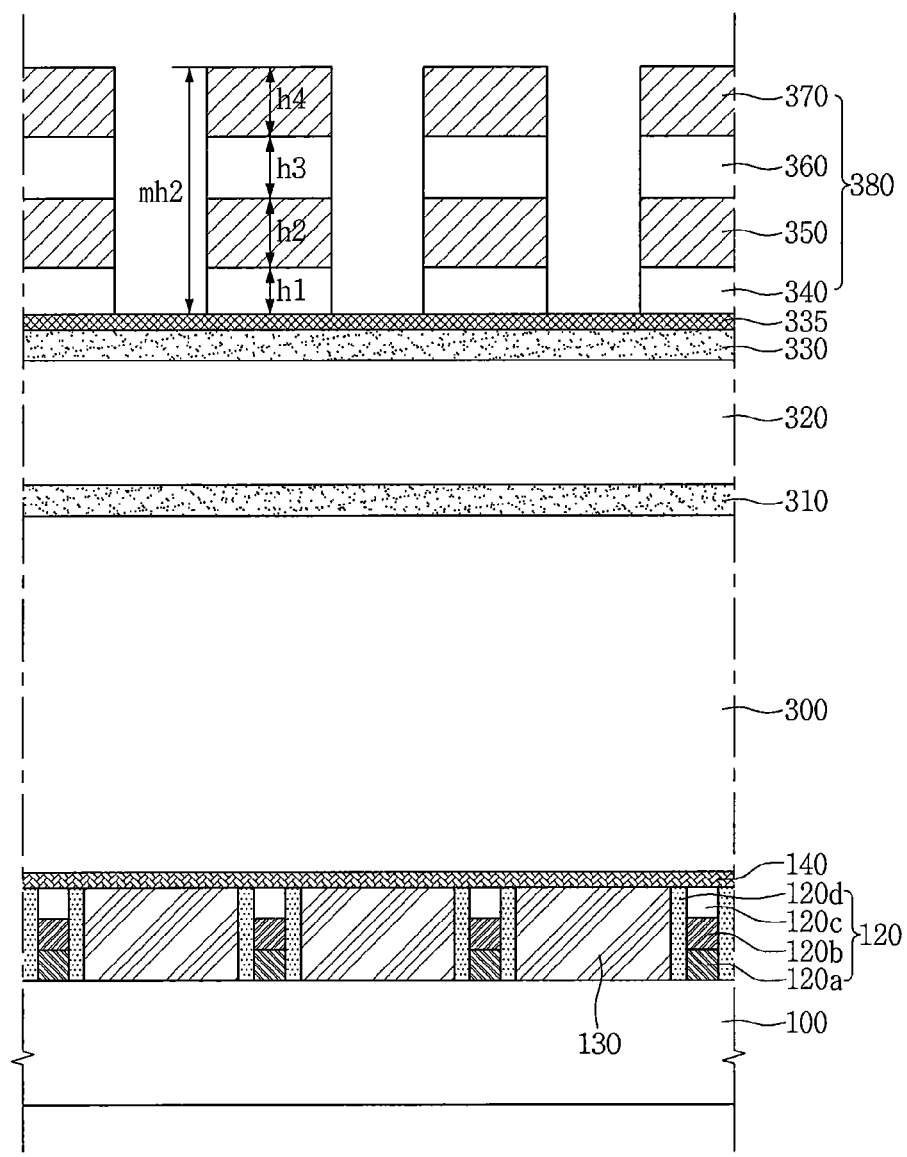

Referring to FIG. 2B, the method of manufacturing the semiconductor device 10 in accordance with various embodiments of the present inventive concept may include forming a multiple mask pattern 380 on the buffer layer 335. The multiple mask pattern 380 may include a first mask pattern 340, a second mask pattern 350, a third mask pattern 360, and a fourth mask pattern 370, which are sequentially stacked.

The forming of the multiple mask pattern 380 may include forming the multiple mask pattern 380 having a thickness mh2 including the first mask pattern 340 having a thickness h1, the second mask pattern 350 having a thickness h2, the third mask pattern 360 having a thickness h3, and the fourth mask pattern 370 having a thickness h4 by performing a lithography process and an etch process on the first mask layer 339, the second mask layer 349, the third mask layer 359, and the fourth mask layer 369, which are formed on the buffer layer 335. The forming of the multiple mask pattern 380 may include selectively exposing the buffer layer 335 by the lithography process and the etch process.

Figure 2C:
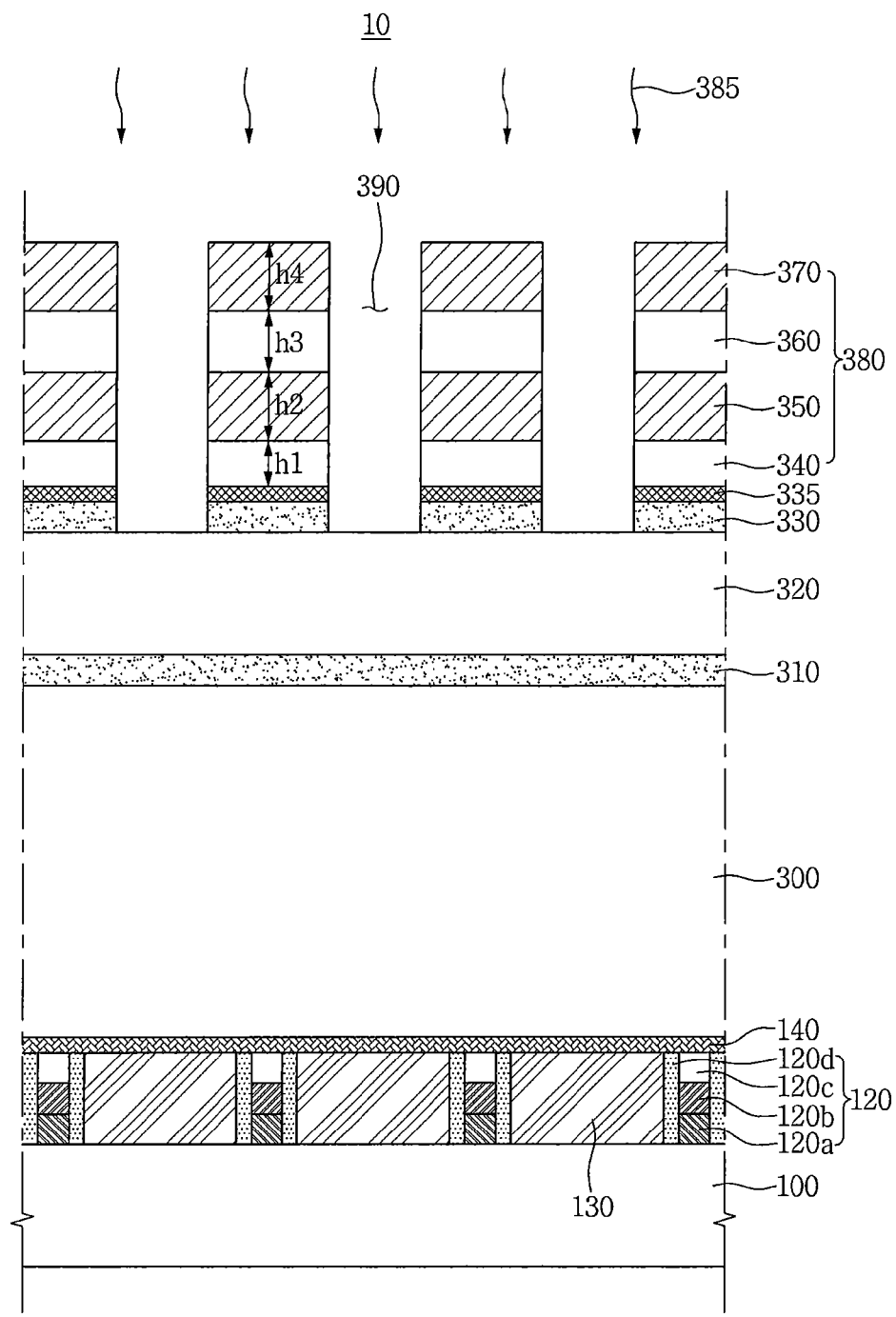

Referring to FIG. 2C, the method of manufacturing the semiconductor device 10 in accordance with various embodiments of the present inventive concept may include selectively removing the buffer layer 335 and the upper supporter layer 330 by performing a first etching process 385 using the multiple mask pattern 380 as an etch mask, and forming a first hole 390 which exposes an upper surface of the upper molding layer 320.

An etchant for forming the first hole 390 may include $CHF_3$ and/or $CH_2F_2$. The buffer layer 335 and the upper supporter layer 330 may be etched using the etchant.

When the first etching process 385 for forming the first hole 390 is performed, the fourth mask pattern 370 located on an uppermost end of the multiple mask pattern 380 may serve as a main mask. The fourth mask pattern 370 may include polysilicon having an etch selectivity with respect to the upper supporter layer 330. Thus, a loss rate of the fourth mask pattern 370 by the etchant $CHF_3$ and/or $CH_2F_2$ used for etching the upper supporter layer 330 may be minimized. Therefore, since the thickness h4 of the fourth mask pattern 370 is minimized, it may function more favorably in a lithography process and/or an etch process.

In the process of performing the first etching process 385 for forming the first hole 390, the fourth mask pattern 370 may be removed. Alternatively, after the first etching process 385 is completed, the fourth mask pattern 370 may be removed.

Figure 2D:
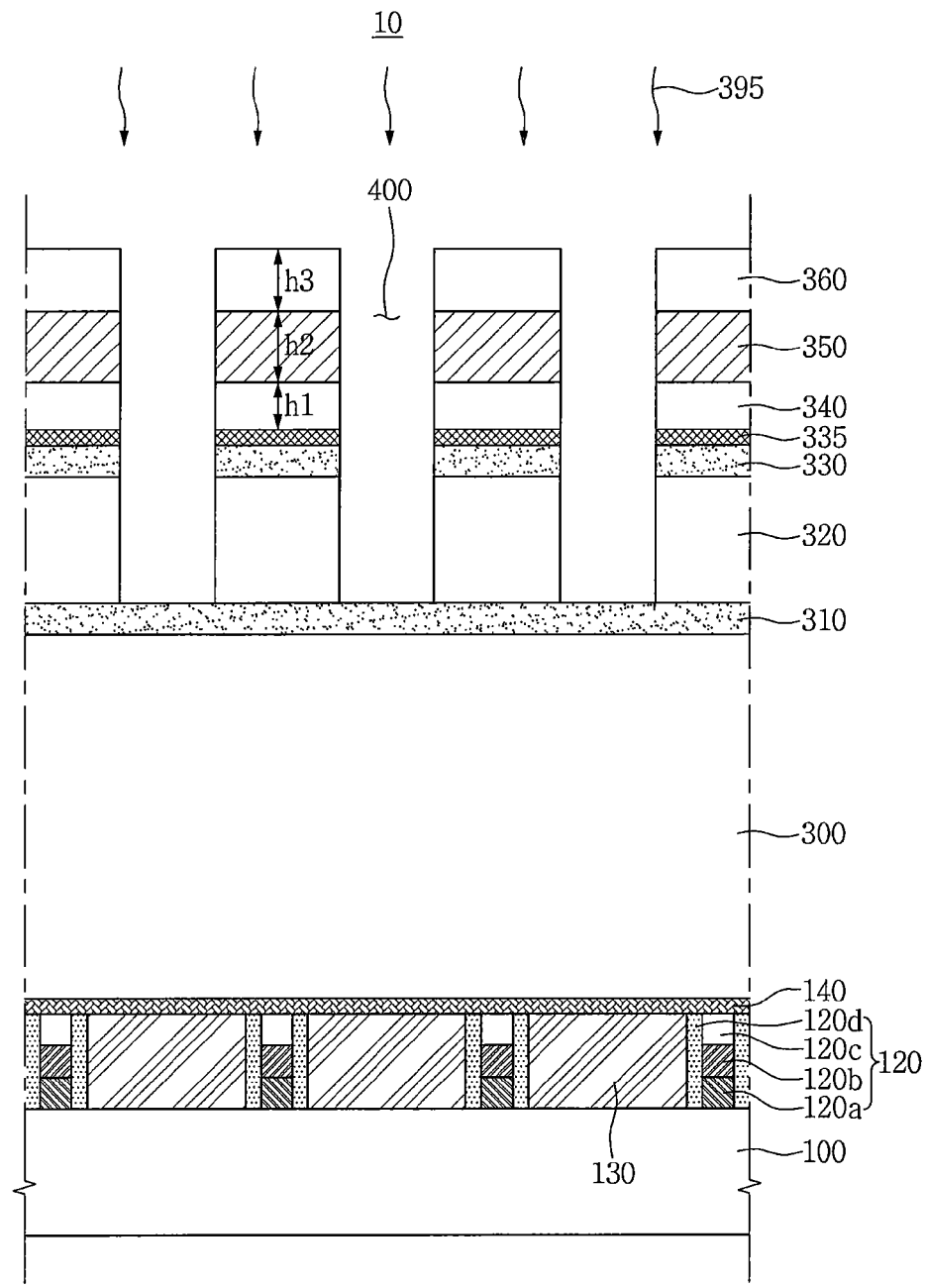

Referring to FIG. 2D, the method of manufacturing the semiconductor device 10 in accordance with various embodiments of the present inventive concept may include selectively removing the upper molding layer 320 by performing a second etching process 395 using the third mask pattern 360 as an etch mask, and forming a second hole 400 which exposes an upper surface of the lower supporter layer 310.

An etchant for forming the second hole 400 may include $C_4F_8$ and/or $C_4F_6$. The upper molding layer 320 may be etched using the etchant.

When the second etching process 395 for forming the second hole 400 is performed, the third mask pattern 360 may serve as a main mask. The third mask pattern 360 may include a metal nitride layer having an etch selectivity with respect to the upper molding layer 320. Thus, a loss rate of the third mask pattern 360 by the etchant $C_4F_8$ and/or $C_4F_6$ used for etching the upper molding layer 320 may be minimized. Therefore, since the thickness h3 of the third mask pattern 360 is minimized, it may function more favorably in a lithography process and/or an etch process.

In the process of performing the second etching process 395 for forming the second hole 400, the third mask pattern 360 may be removed. Alternatively, after the second etching process 395 is completed, the third mask pattern 360 may be removed.

Figure 2E:
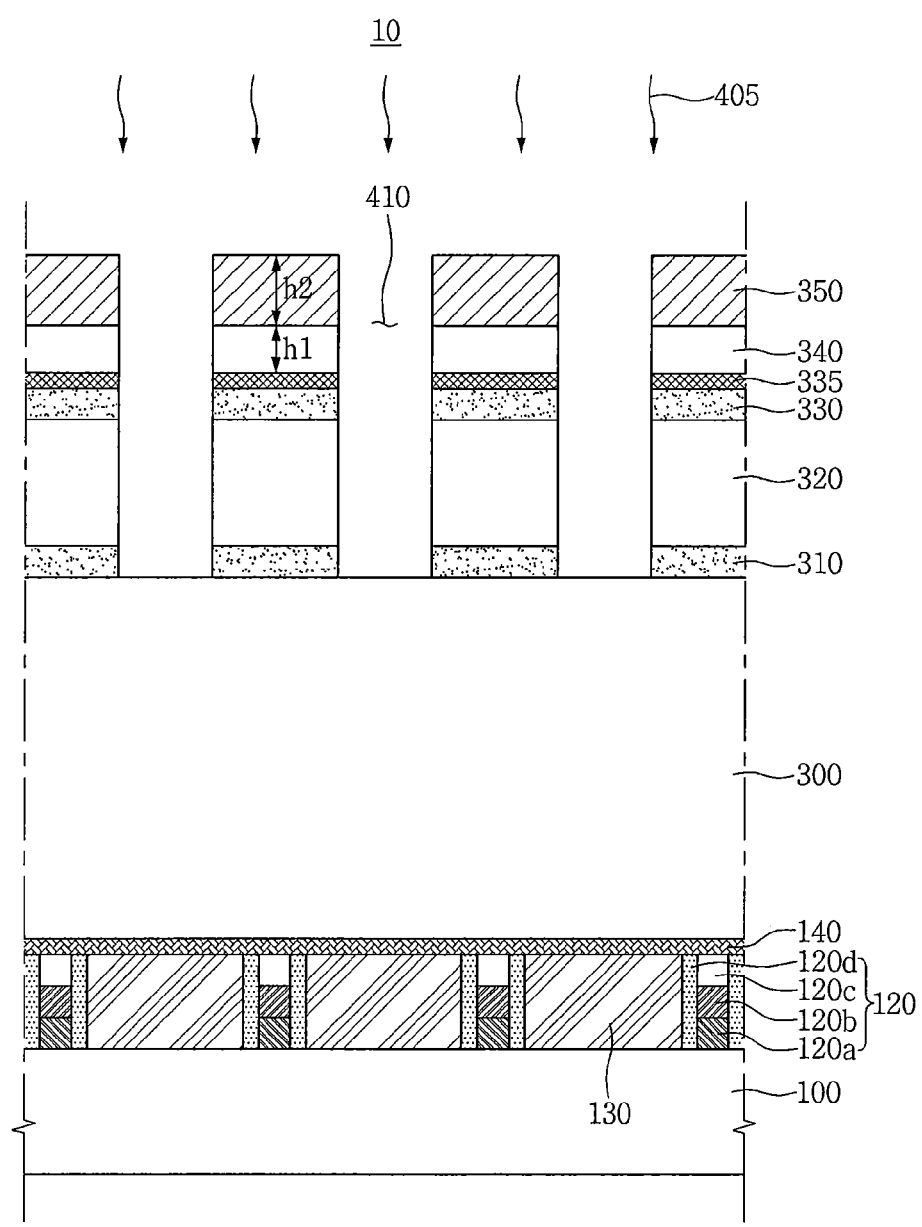

Referring to FIG. 2E, the method of manufacturing the semiconductor device 10 in accordance with various embodiments of the present inventive concept may include selectively removing the lower supporter layer 310 by performing a third etching process 405 using the second mask pattern 350 as an etch mask, and forming a third hole 410 which exposes an upper surface of the lower molding layer 300.

An etchant for forming the third hole 410 may include $CHF_3$ and/or $CH_2F_2$. The lower supporter layer 310 may be etched using the etchant.

When the third etching process 405 for forming the third hole 410 is performed, the second mask pattern 350 may serve as a main mask. The second mask pattern 350 may include polysilicon having an etch selectivity with respect to the lower supporter layer 310. Thus, a loss rate of the second mask pattern 350 by the etchant $CHF_3$ and/or $CH_2F_2$ used for etching the lower supporter layer 310 may be minimized. Therefore, since the thickness h2 of the second mask pattern 350 is minimized, it may function more favorably in a lithography process and/or an etch process.

In the process of performing the third etching process 405 for forming the third hole 410, the second mask pattern 350 may be removed. Alternatively, after the third etching process 405 is completed, the second mask pattern 350 may be removed.

Figure 2F:
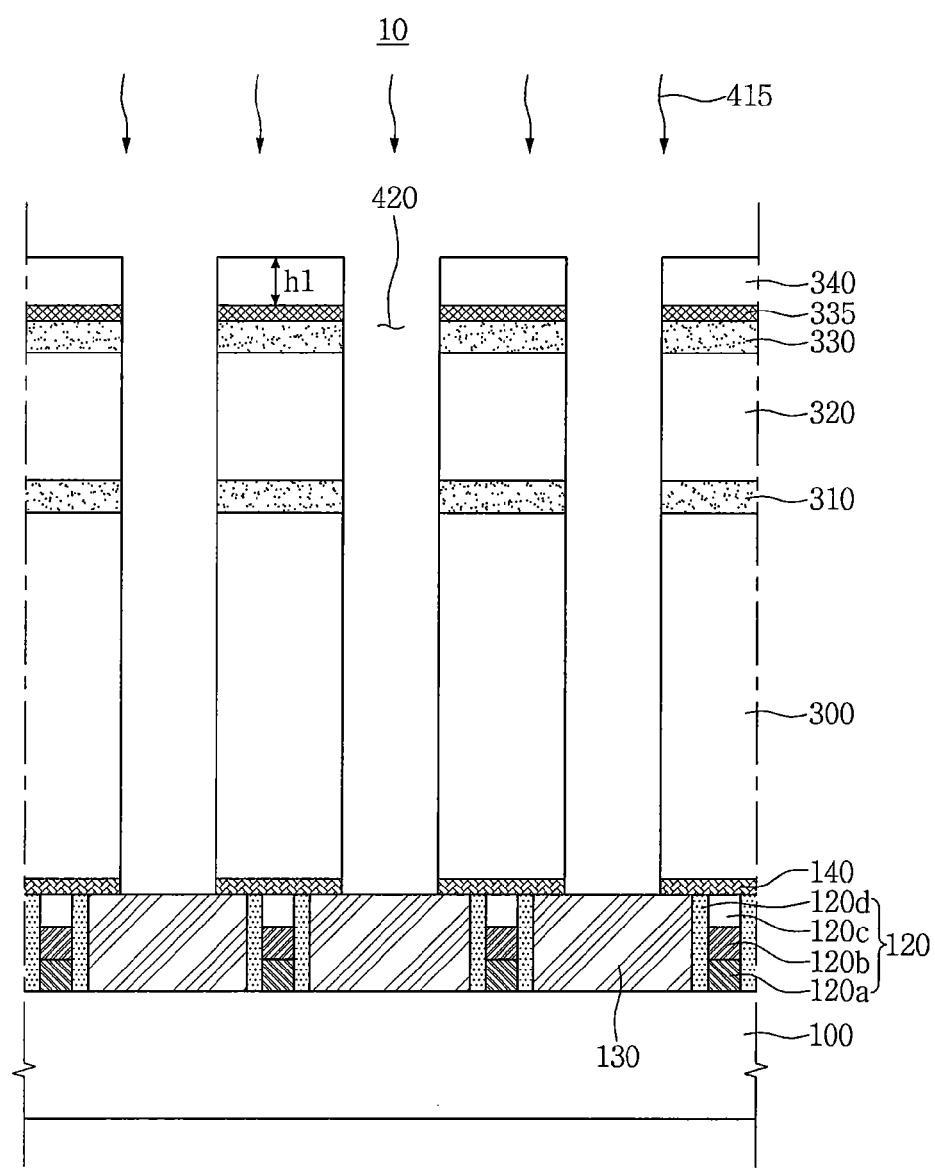

Referring to FIG. 2F, the method of manufacturing the semiconductor device 10 in accordance with various embodiments of the present inventive concept may include selectively removing the lower molding layer 300 and the stopping insulating layer 140 by performing a fourth etching process 415 using the first mask pattern 340 as an etch mask, and forming a fourth hole 420 which exposes an upper surface of the contact pad 130.

The forming of the fourth hole 420 may include selectively removing the exposed lower molding layer 300 using the first mask pattern 340 as an etch mask, and exposing an upper surface of the stopping insulating layer 140. Further, the forming of the fourth hole 420 may include selectively removing the exposed stopping insulating layer 140 using the first mask pattern 340 as an etch mask, and exposing the contact pad 130.

An etchant for forming the fourth hole 420 may include $C_4F_8$ and/or $C_4F_6$. The lower molding layer 300 and the stopping insulating layer 140 may be etched using the etchant.

When the fourth etching process 415 for forming the fourth hole 420 is performed, the first mask pattern 340 may include a metal nitride layer having an etch selectivity with respect to the lower molding layer 300. Thus, a loss rate of the first mask pattern 340 by the etchant $C_4F_8$ and/or $C_4F_6$ used for etching the lower molding layer 300 may be minimized. Therefore, since the thickness h1 of the first mask pattern 340 is minimized, it may function more favorably in a lithography process and/or an etch process.

In the process of performing the fourth etching process 415 for forming the fourth hole 420, the first mask pattern 340 may be removed. Alternatively, after the fourth etching process 415 is completed, the first mask pattern 340 may be removed.

In the some embodiments, as described with reference to FIG. 2B, the multiple mask pattern 380 including material layers each having an excellent etch selectivity with respect to the lower molding layer 300, the lower supporter layer 310, the upper molding layer 320, and the upper supporter layer 330 is formed. Thus, in the four etching processes described with reference to FIG. 2C-2F, in which etched layers including the lower molding layer 300, the lower supporter layer 310, the upper molding layer 320, and the upper supporter layer 330 are etched, the first mask pattern 340, the second mask pattern 350, the third mask pattern 360, and the fourth mask pattern 370, which correspond to the etched layers, respectively, have very small loss rates. The thicknesses h1, h2, h3, and/or h4 of the mask patterns 340, 350, 360, and 370 may be reduced. Thereby, the overall thickness mh2 of the multiple mask pattern 380 may be relatively reduced compared to a conventional single mask pattern, thus providing an easier lithography process and/or etch process, and etching distributions of the etched layers (the lower molding layer, the supporter layer, and the upper molding layer) that are improved. Therefore, a storage electrode of a capacitor having a high aspect ratio may be implemented, and thus capacitance of the capacitor may be increased.

Figure 2G:
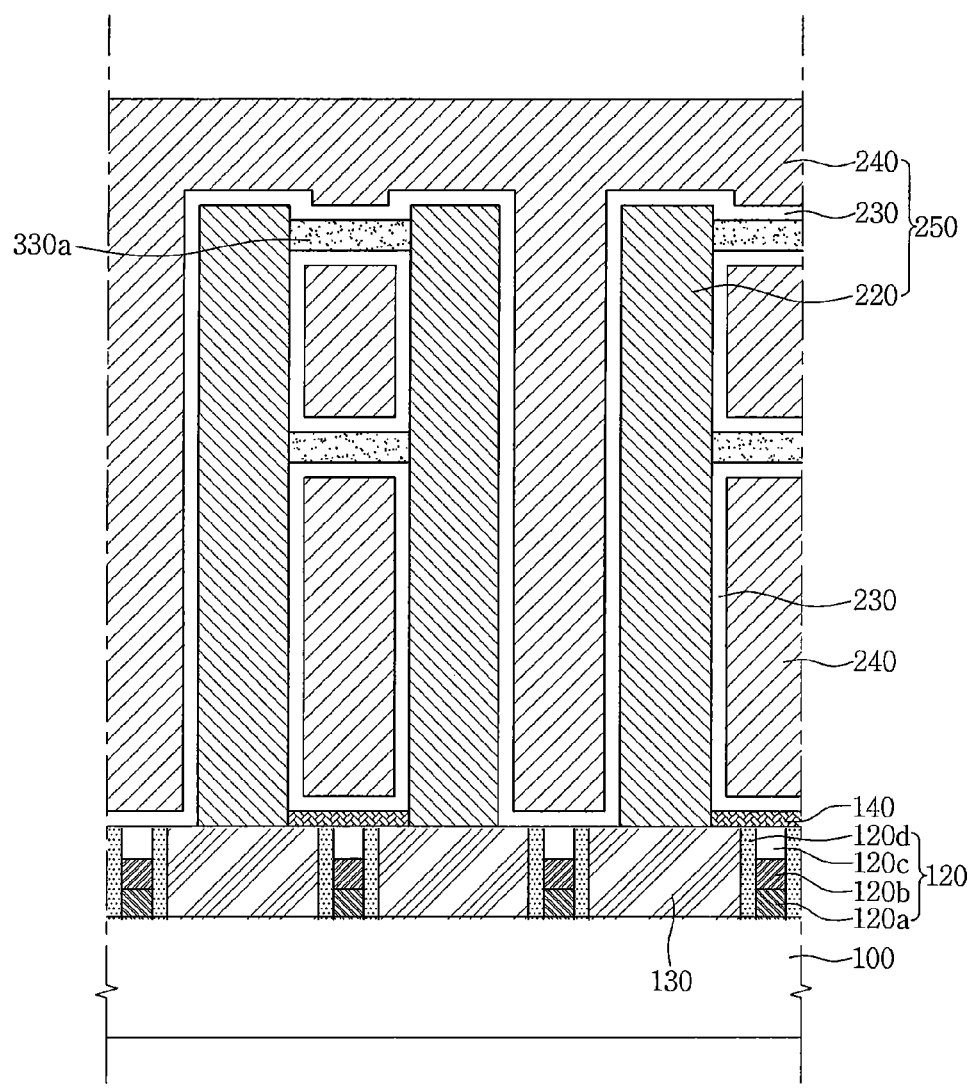

Referring to FIG. 2G, the method of manufacturing the semiconductor device 10 in accordance with various embodiments of the present inventive concept may include forming storage electrodes 220 inside the fourth hole 420, forming a supporter pattern 330a, removing the upper supporter layer 330, the upper molding layer 320, the lower supporter layer 310, the lower molding layer 300, and the stopping insulating layer 140, and sequentially forming a dielectric layer 230 and a plate electrode 240.

The forming of the storage electrode 220, in substantially the same manner as described in FIG. 1E, may include forming a conductive material on the semiconductor substrate 100 having the fourth hole 420 to fill the fourth hole 420, and planarizing the conductive material until the buffer layer 335 is exposed.

The forming of the supporter pattern 330a, in substantially the same manner as described in FIG. 1F, may include patterning the upper supporter layer 330, and forming an upper supporter pattern 330a having an opening. The upper supporter pattern 330a may be connected to a portion of side surfaces of the storage electrode 220.

After the upper supporter pattern 330a is formed, the upper molding layer 320 exposed by the opening, the lower supporter layer 310, the lower molding layer 300, and the stopping insulating layer 140 may be removed using an etching process. In the etching process, the buffer layer 335 formed on the upper supporter pattern 330a may be also removed. The lower supporter layer 310 may be patterned to be aligned with the supporter pattern 330a.

The dielectric layer 230 may be formed of the dielectric layer 230 on the semiconductor substrate 100 in which the buffer layer 335, the upper molding layer 320, the lower supporter layer 310, the lower molding layer 300, and the stopping insulating layer 140 are removed. The dielectric layer 230 may be conformally formed on exposed surfaces of the storage electrode 220, the patterned stopping insulating layer 140, the patterned lower supporter layer 310, and the upper supporter pattern 330a.

The plate electrode 240 may be formed on the semiconductor substrate 100 on which the dielectric layer 230 is formed. Therefore, a capacitor 250 including the storage electrode 220, the dielectric layer 230, and the plate electrode 240 may be formed.

Figure 3:
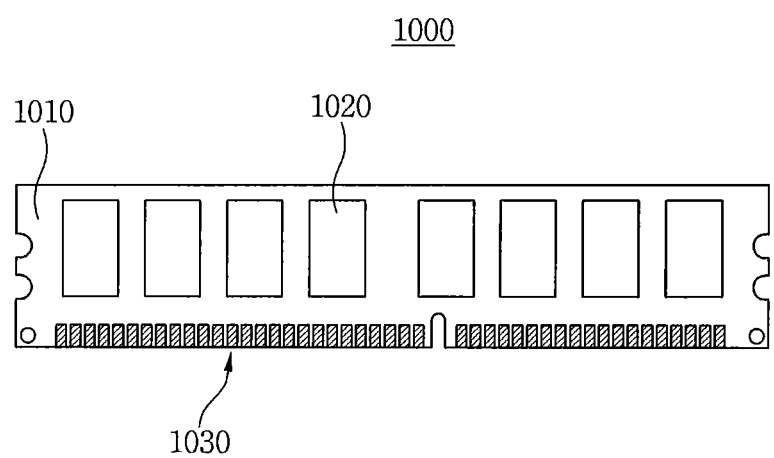
FIG. 3 is a schematic view showing a semiconductor module including the semiconductor device in accordance with various embodiments of the present inventive concept.

FIG. 3 is a schematic view showing a semiconductor module 1000 including at least one of the semiconductor devices manufactured in accordance with various embodiments of the present inventive concept.

Referring to FIG. 3, the semiconductor module 1000 may be a memory module including a memory device. The semiconductor module 1000 may include a module substrate 1010, a plurality of semiconductor devices 1020 disposed on the module substrate 1010, and a plurality of terminals 1030 arranged on the module substrate 1010.

The module substrate 1010 may include a printed circuit board (PCB) or a wafer.

The terminals 1030 may include a conductive metal such as copper. The terminals 1030 may be electrically connected to the semiconductor devices 1020.

The semiconductor devices 1020 may be memory devices. The semiconductor devices 1020 may be DRAM devices. The semiconductor devices 1020 each may be a semiconductor device or a semiconductor package including the semiconductor device in accordance with various embodiments of the present inventive concept.

Figure 4:
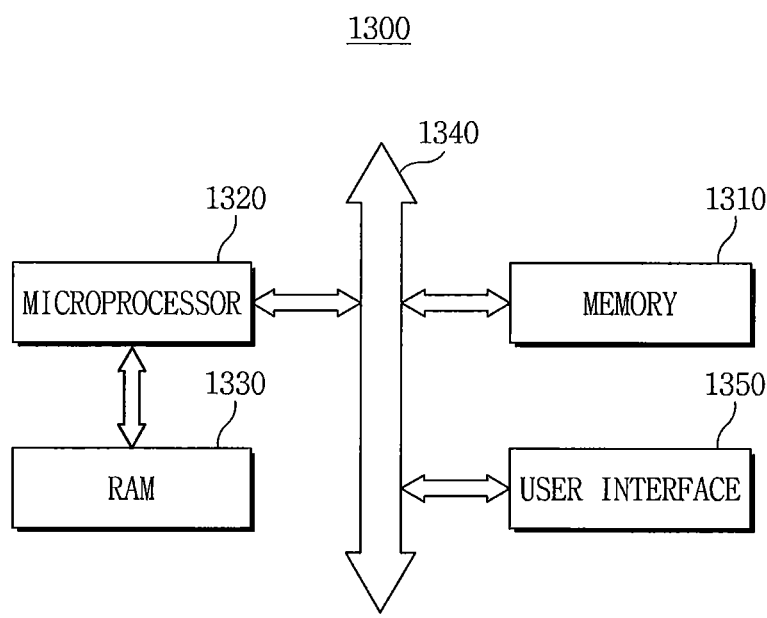
FIG. 4 is a block diagram showing an electronic system including the semiconductor device in accordance with various embodiments of the inventive concept.

FIG. 4 is a block diagram showing an electronic system 1300 including the semiconductor device manufactured in accordance with the embodiments of the inventive concept.

Referring to FIG. 4, the electronic system 1300 may include the semiconductor device in accordance with various embodiments of the present inventive concept. The electronic system 1300 may be used to provide a mobile device or a computer. For example, the electronic system 1300 may include a memory system 1310, a microprocessor 1320, a RAM 1330, and/or a user interface 1350 which performs data communication using a bus 1340.

The microprocessor 1320 may program and control the electronic system 1300. The RAM 1330 may be used as an operational memory of the microprocessor 1320. The microprocessor 1320, the RAM 1330, and/or other components may be assembled within a single package. The memory system 1310 or the RAM 1330 may include a semiconductor device in accordance with any one of the embodiments of the inventive concept, or a semiconductor package including the semiconductor device.

The user interface 1350 may be used to input data to the electronic system 1300, or to output data from the electronic system 1300.

The memory system 1310 may store operational code of the microprocessor 1320, data processed by the microprocessor 1320, or data received from the outside. The memory system 1310 may include a controller and a memory.

According to the embodiments of the inventive concept, a multiple mask pattern corresponding one-to-one with respect to a molding layer and a supporter layer is formed using material layers each having an etch selectivity with respect to the molding layer and the supporter layer.

Thus, when etching processes each are performed on the molding layer and the supporter layer, a loss rate of each mask pattern included in the multiple mask pattern is reduced, and thus, an overall thickness of the multiple mask pattern is reduced. The resulting lithography process and/or etch process may be easier, etching distributions of the molding layer and the supporter layer may be improved, and a storage electrode having a high aspect ratio can be formed. Therefore, capacitance of a capacitor may also be increased.

The above-disclosed subject matter is to be considered illustrative, and not restrictive, and the appended claims are intended to cover all such modifications, enhancements, and other embodiments, which fall within the true spirit and scope. Thus, to the maximum extent allowed by law, the scope is to be determined by the broadest permissible interpretation of the following claims and their equivalents, and shall not be restricted or limited by the foregoing detailed description.

What is claimed is:

1. A method of manufacturing a semiconductor device, comprising:
    forming a molding layer and a supporter layer on a semiconductor substrate;
    forming a multiple mask layer including a first mask layer and a second mask layer formed on the first mask layer, on the supporter layer, wherein the first mask layer comprises a first material having a first etch selectivity with respect to the molding layer, and wherein the second mask layer comprises a second material having a second etch selectivity with respect to the supporter layer;
    patterning the multiple mask layer to form a first mask pattern and a second mask pattern on the first mask pattern;
    performing a first etching process using the second mask pattern as an etch mask to etch the supporter layer; and
    performing a second etching process using the first mask pattern as an etch mask to etch the molding layer and form a hole,
    wherein the second mask pattern is etched and removed during the first etching process.

2. The method of claim 1, further comprising:
    forming a storage electrode in the hole;
    patterning the supporter layer to form a supporter pattern;
    removing the molding layer to expose the storage electrode and the supporter pattern;
    conformally forming a dielectric layer on the storage electrode and the supporter pattern; and
    forming a plate electrode on the dielectric layer.

3. The method of claim 1, further comprising removing the first mask pattern after completing the second etching process.

4. The method of claim 1, wherein the first mask layer comprises a metal nitride.

5. The method of claim 4, wherein the second mask layer comprises silicon.

6. The method of claim 5, wherein the second mask layer further comprises polysilicon.

7. The method of claim 1, wherein the molding layer comprises silicon oxide and the supporter layer comprises silicon nitride.

8. The method of claim 7, further comprising:
    forming a buffer layer between the supporter layer and the first mask layer,
    wherein the buffer layer is etched during the first etching process.

9. A method of manufacturing a semiconductor device, comprising:
    forming a lower molding layer, a lower supporter layer, an upper molding layer, and an upper supporter layer on a semiconductor substrate;
    forming a multiple mask layer including a first mask layer, a second mask layer, a third mask layer, and a fourth mask layer, which are sequentially stacked on the upper supporter layer;
    patterning the multiple mask layer to form a first mask pattern, a second mask pattern, a third mask pattern, and a fourth mask pattern, which are stacked;
    performing a first etching process using the fourth mask pattern as an etch mask to etch the upper supporter layer;

performing a second etching process using the third mask pattern as an etch mask to etch the upper molding layer;

performing a third etching process using the second mask pattern as an etch mask to etch the lower supporter layer; and performing a fourth etching process using the first mask pattern as an etch mask to etch the lower molding layer and form a hole.

10. The method of claim 9, wherein the first and third mask layers each comprise a metal nitride.

11. The method of claim 9, wherein the second and fourth mask layers each comprise polysilicon.

12. The method of claim 9, wherein the molding layer comprises silicon oxide and the supporter layer comprises silicon nitride.

13. The method of claim 9, further comprising:
forming a storage electrode in the hole;
patterning the upper supporter layer to form a supporter pattern;
removing the upper molding layer, the lower supporter layer, and the lower molding layer and exposing the storage electrode and the supporter pattern;
conformally forming a dielectric layer on the storage electrode and the supporter pattern; and
forming a plate electrode on the dielectric layer.

14. The method of claim 13, wherein the removing of the upper molding layer, the lower supporter layer, and the lower molding layer comprises removing the upper molding layer and the lower molding layer, and patterning the lower supporter layer to be aligned with the supporter pattern.

15. A method of manufacturing a semiconductor device, comprising:
forming a molding layer on a semiconductor substrate;
forming a supporter layer on the molding layer;
forming a first mask layer, having a first etch selectivity with respect to the molding layer, on the supporter layer;
forming a second mask layer, having a second etch selectivity, different from the first etch selectivity, with respect to the supporter layer, on the first mask layer;
performing a first etching process using a first etchant to etch the supporter layer, wherein the second mask layer is used as an etch mask for the first etching process; and
performing a second etching process using a second etchant to etch the molding layer, wherein the first mask layer is used as an etch mask for the second etching process.

16. The method of claim 15,
wherein the first mask layer comprises a thickness h1 and the second mask layer comprises a thickness h2,
wherein the thickness h1 is less than the thickness h2, and
wherein the second mask layer comprises polysilicon and the first mask layer comprises a metal nitride.

17. The method of claim 15,
wherein the molding layer comprises silicon oxide, and the supporter layer comprises silicon nitride.

18. The method of claim 15, further comprising:
forming a buffer layer between the supporter layer and the first mask layer,
wherein the buffer layer is etched during the first etching process.

19. The method of claim 15,
wherein the first etchant used by the first etch process to etch the supporter layer comprises $CHF_3$ and/or $CH_2F_2$, and
wherein the second etchant used by the second etch process to etch the molding layer comprises $C_4F_8$ and/or $C_4F_6$.

* * * * *